US006950476B2

(12) United States Patent
Tarrab et al.

(10) Patent No.: US 6,950,476 B2
(45) Date of Patent: Sep. 27, 2005

(54) APPARATUS AND METHOD FOR PERFORMING SISO DECODING

(75) Inventors: Moshe Tarrab, Holon (IL); Mark Elnekave, Ramat Gan (IL); Jacob Tokar, Ashdod (IL); Eran Pisek, Holon (IL)

(73) Assignee: Freescale Semiconductor, Inc., Austin, TX (US)

( * ) Notice: Subject to any disclaimer, the term of this patent is extended or adjusted under 35 U.S.C. 154(b) by 773 days.

(21) Appl. No.: 09/789,242

(22) Filed: Feb. 20, 2001

(65) Prior Publication Data

US 2001/0016932 A1 Aug. 23, 2001

(30) Foreign Application Priority Data

Feb. 21, 2000 (EP) ............................................ 00103624

(51) Int. Cl.$^7$ ............................ H04L 23/02; H04L 5/12

(52) U.S. Cl. ........................ 375/265; 375/262; 375/341; 714/792; 714/795; 714/796

(58) Field of Search ................................ 375/262, 265, 375/341, 340; 714/792, 794, 795, 796, 786

(56) References Cited

U.S. PATENT DOCUMENTS

| | | | | |
|---|---|---|---|---|
| 5,933,462 A | | 8/1999 | Viterbi et al. ................ | 375/341 |
| 6,028,899 A | * | 2/2000 | Petersen ...................... | 375/341 |
| 6,477,679 B1 | * | 11/2002 | Such et al. .................. | 714/755 |
| 6,516,437 B1 | * | 2/2003 | Van Stralen et al. ......... | 714/755 |

OTHER PUBLICATIONS

Yiin L et al, "MLSE and soft–output equalization for trellis–coded continuous phase modulation", IEEE Transactions on communications, US, IEEE Inc. New York, vol. 45, No. 6, Jun. 1, 1997, pp. 651–659.

Liu Y, Follorier M., Lin S. "Map algorithms for decoding linear block codes based on sectionalized trellis diagrams", IEEE Globecom 1998, vol. 1, Nov. 8–12, 1998, pp. 562–566.

* cited by examiner

*Primary Examiner*—Jean B. Corrielus (57) ABSTRACT

A device and method for performing SISO decoding. The method comprising the steps of: (a) providing a trellis representative of an output of a convolutional encoder, the convolutional encoder has a coding rate of R, the trellis having a block length T. (b) assigning an initial conditions to each starting node of the trellis for a forward iteration through the trellis. (c) computing a forward metric for each node, starting from the start of the trellis and advancing forward through the trellis and storing forward metrics of nodes of a plurality of starting stages of windows. (d) repeating stages d(1)–d(3) until all lambdas of the trellis are calculated; d(1) retrieving forward metrics of nodes of a starting stage of a window, the retrieved forward metrics were computed and stored during step (c). d(2) computing and storing forward metrics for each node, starting from a second stage of the window and ending at the ending stage of the window. d(3) computing backward metrics for each node, starting from the ending stage of the window and ending at the starting stage of the window; wherein when backward metrics of nodes of a stage are computed and the forward metrics of the nodes of an adjacent stage were previously computed, the computation of backward metrics is integrated with the computation of lambda from the stage to the adjacent stage and a storage of the calculated lambdas.

38 Claims, 4 Drawing Sheets

APPARATUS AND METHOD FOR PERFORMING SISO DECODING

FIELD OF THE INVENTION

Apparatus and method for performing Soft Input-Soft Output decoding, and especially an apparatus and method for performing log Map and max-log-map algorithms.

BACKGROUND OF THE INVENTION

Turbo Coding (i.e.—TC) is used for error control coding in digital communications and signal processing. The following references give some examples of various implementations of the TC: "Near Shannon limit error correcting coding and decoding: turbo-codes", by Berrou, Glavieux, Thitimajshima, IEEE International Conference of Communication. Geneva Switzerland, pp. 1064–1070, May 1993; "Implementation and Performance of a Turbo/MAP Decoder", Pietrobon, International Journal of Satellite Communication; "Turbo Coding", Heegard and Wicker, Kluwer Academic Publishers 1999.

MAP algorithm and soft output Viterbi algorithm (SOVA) are Soft Input Soft Output (i.e.—SISO) decoding algorithms that have gained wide acceptance in the area of communications. Both algorithms are mentioned in U.S Pat. No. 5,933,462 of Viterbi et al.

The TC has gained wide acceptance in the area of communications, such as in cellular networks, modems, and satellite communications. Some turbo encoders consists of two parallel-concatenated systematic convolutional encoders separated by a random interleaver. A turbo decoder has two soft-in soft-out (SISO) decoders. The output of the first SISO is coupled to the input of the second SISO via a first interleaver, while the output of the second SISO is coupled to an input of the first SISO via a feedback loop that includes a deinterleaver.

A common SISO decoder uses either a maximum a posteriori (i.e.—MAP) decoding algorithm or a Log MAP decoding algorithm. The latter algorithm is analogues to the former algorithm but is performed in the logarithmic domain. Another common decoding algorithm is the max log MAP algorithm. The log MAP is analogues to the log MAP but the implementation of the former involves an addition of correction factor. Briefly, the MAP finds the most likely information bit to have been transmitted in a coded sequence.

The output signals of a convolutional encoder are transmitted via a channel and are received by a receiver that has a turbo decoder. The channel usually adds noise to the transmitted signal.

During the decoding process a trellis of the possible states of the coding is defined. The trellis includes a plurality of nodes (states), organized in T stages, each stage has N=2sup (K-1) nodes, whereas T being the number of received samples taken into account for evaluating which bit was transmitted from a transmitter having the convolutional encoder and K is the constraint length of the code used for encoding. Each stage is comprised of states that represent a given time. Each state is characterized by a forward state metric, commonly referred to as alpha ($\alpha$ or a) and by a backward state metric, commonly referred to as beta ($\beta$ or b). Each transition from a state to another state is characterized by a branch metric, commonly referred to as gamma ($\gamma$).

Alphas, betas and gammas are used to evaluate a probability factor that indicates which signal was transmitted. This probability factor is commonly known as lambda ($\Lambda$). A transition from a stage to an adjacent stage is represented by a single lambda.

The articles mentioned above describe prior art methods for performing MAP algorithm, these prior art methods comprise of three steps. During the first step the alphas that are associated with all the trellis states are calculated, starting with the states of the first level of depth and moving forward. During the second step the betas associated with all the trellis states are calculated, starting with the states of the L'th level of depth and moving backwards. Usually, while betas are calculated the lambdas can also be calculated. Usually, the gammas are calculated during or even before the first step.

The TC can be implemented in hardware or in software. When implemented in hardware, the TC will generally run much faster than the TC implemented in software. However, implementing the TC in hardware is more expensive in terms of semiconductor surface area, complexity, and cost.

Calculating the lambdas of the whole trellis is very memory intensive. A very large number of alphas, betas and gammas must be stored.

Another prior art method is described in U.S Pat. No. 5,933,462 of Viterbi. This patent describes a soft decision output decoder for decoding convolutionally encoded code words. The decoder is based upon "generalized" Viterbi decoders and a dual maxima processor. The decoder has various drawbacks, such as, but not limited to the following drawbacks: The decoder either has a single backward decoder or two backward decoders. In both cases, and especially in the case of a decoder with one backward decoder, the decoder is relatively time consuming. In both cases, a learning period L equals a window W in which valid results are provided by backward decoder and forward decoder. Usually, L<W and the decoder described in U.S. Pat. No. 5,933,462 is not effective. Furthermore, at the end of the learning period an estimation of either a forward metric or backward metric are provided. Calculations that are based upon these estimations, such as the calculations of forward metrics, backward metrics and lambdas are less accurate than calculations that are based upon exact calculations of these variables.

The decoder described in U.S. Pat. No. 5,933,462 is limited to calculate state metrics of nodes over a window having a length of 2L, where L is a number of constraint lengths, 2L is smaller than block length T of the trellis.

There is a need to provide an improved device and method for performing high-accuracy SISO decoding that is not memory intensive. There is a need to provide a fast method for performing SISO decoding and provide an accelerating system for enhancing the performances of embedded systems.

BRIEF DESCRIPTION OF THE DRAWINGS

While the invention is pointed out with particularity in the appended claims, other features of the invention are disclosed by the following detailed description taken in conjunction with the accompanying drawings, in which:

DESCRIPTION OF THE PREFERRED EMBODIMENT

It should be noted that the particular terms and expressions employed and the particular structural and operational details disclosed in the detailed description and accompanying drawings are for illustrative purposes only and are not intended to in any way limit the scope of the invention as described in the appended claims.

The invention provides an improved device and method for performing high-accuracy SISO decoding that is not memory intensive. The trellis is divided to a plurality of windows. Accurate alphas (betas) and gammas are calculated during a first step in which alphas of a whole trellis are calculated. During this step a plurality of alphas of nodes of starting stages of windows (betas of nodes of ending stages of windows) are stored. During another steps the alphas (betas) betas (alphas) and gammas are calculated and stored in a fast internal memory module. These calculated values are used in another step of calculating accurate betas (alphas) and accurate lambdas of a window, and providing the lambdas to an external memory. The internal memory stores a plurality of variables that are required to calculate the alphas, betas gamma and lambdas of a window that is much smaller than the whole trellis.

The invention provides an accelerating system that for enhancing the performances of embedded systems. The system has an internal memory and processors that can access an external memory and exchange information from a host processor or another embedded system and calculate lambdas by itself.

Figure 1:
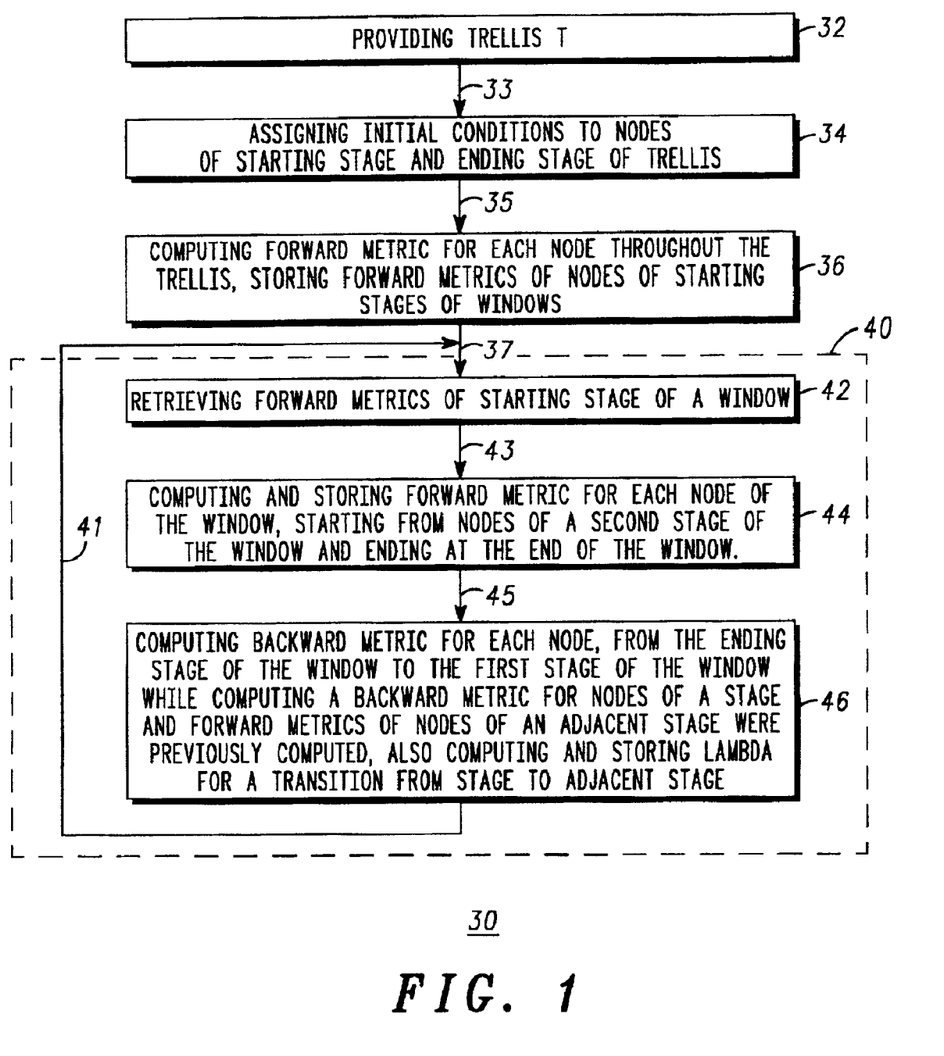
FIGS. 1–2 illustrates in flow chart form, two methods for performing SISO decoding, in accordance with a preferred embodiment of the present invention.

FIG. 1 is a simplified flow chart diagram illustrating method 30 of the present invention. Preferably, method 30 comprises steps 32, 34, 36, and 40, step 40 further comprising steps 42, 44, and 46, all steps illustrated by blocks. Solid lines 33, 35, 37, 41, 43 and 45, coupling the steps indicate a preferred method flow. Method 30 requires that only a portion of the variables associated to the lambda calculations are stored in an internal memory. The method is fast and does not require a learning period.

Method 30 starts in step 32 of providing a trellis representative of an output of a convolutional encoder, the convolutional encoder has a coding rate of R, the trellis having a block length T. The trellis is divided to a plurality of windows. The provision of the trellis involves receiving and storing a plurality of signals, such as parity bits Yp1,k Yp2,k, representing T transmitted symbols.

Step 32 is followed by step 34 of assigning initial conditions to each node of the starting stage and the ending stage of the trellis.

Step 34 is followed by step 36 of computing a forward metric for each node, starting from the start of the trellis and advancing forward through the trellis and storing forward metrics of nodes of a plurality starting stages of windows. Preferably, the forward metrics of nodes of the starting stages of windows are stored in an external memory module.

Step 36 is followed by step 40 of computing lambdas. Step 40 conveniently comprises of steps 42, 44 and 46. Steps 42–46 are repeated until the all lambdas associated to the trellis are calculated.

During step 42 retrieving forward metrics of nodes of a starting stage of a window, the retrieved forward metrics were computed and stored during step 36. Conveniently, the windows are selected so that the backward metrics of the nodes of the ending stage can be calculated in a swift and in an exact manner. Usually, the computation of backward metrics of nodes of an ending stages of a window that is not a last window in the trellis, is preceded by a computation of a backward metrics of a following window, wherein the starting stage of the following window follows the ending stage of the window. Preferably, during a first iteration of steps 42–46 the lambdas of the last window of the trellis are calculated and further iterations are used to calculate lambdas of preceding windows.

Step 42 is followed by step 44 of computing and storing forward metrics for each node, starting from a second stage of the window and ending at the ending stage of the window. Preferably, the forward metrics are stored in an internal memory module.

Step 44 is followed by step 46 of computing backward metrics for each node, starting from the ending stage of the window and ending at the starting stage of the window; wherein when backward metrics of nodes of a stage are computed and the forward metrics of the nodes of an adjacent stage were previously computed, the computation of backward metrics is integrated with the computation of lambda from the stage to the adjacent stage. After a lambda is calculated it is stored. Preferably it is stored in an external memory module. As indicated by path 41, step 46 is followed by step 42 until all lambdas of the trellis are calculated and stored.

Conveniently, all windows have the same length WN, wherein WN is much smaller than T. The windows do not overlap. Preferably, step 40 starts by calculating lambdas of the last window of the trellis and advances backward through the trellis.

Preferably, method 40 is used to implement the Log MAP algorithms. Conveniently, gammas are calculated during steps 34 and 44.

Figure 2:
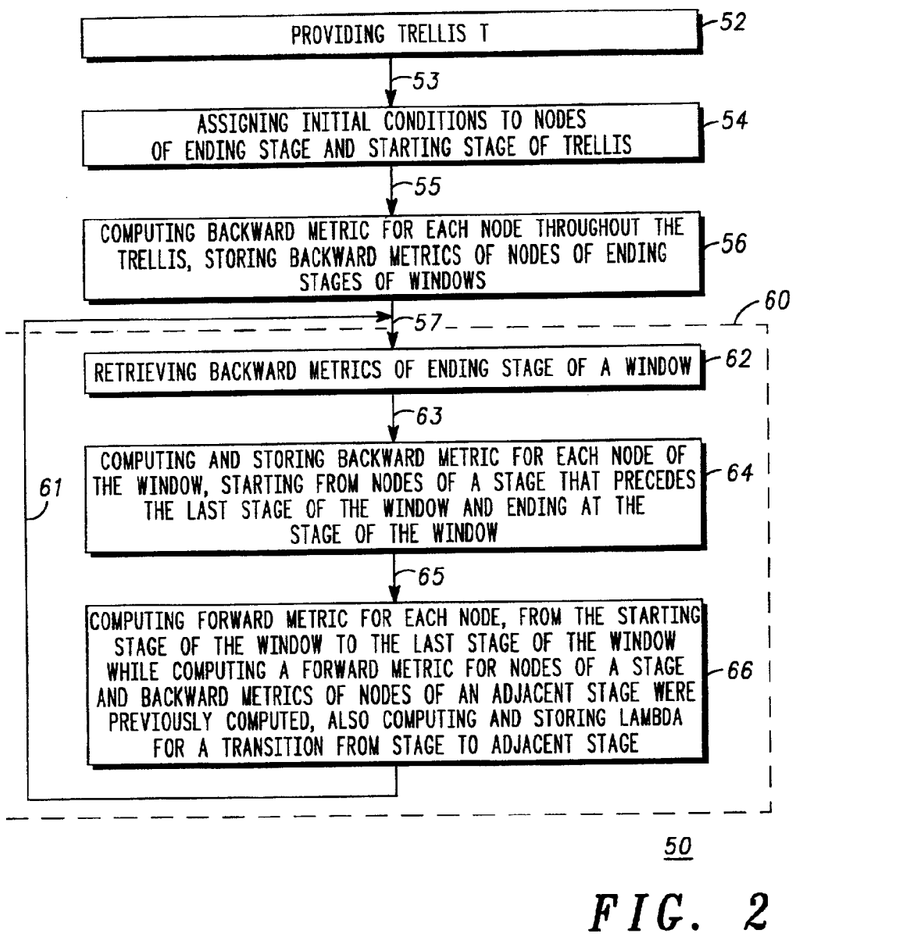

FIG. 2 is a simplified flow chart diagram illustrating method 50 of the present invention. Preferably, method 50 comprises steps 52, 54, 56, and 60, step 60 further comprising steps 62, 64 and 66, all steps illustrated by blocks. Solid lines 53, 55, 57, 61, 63, and 65, coupling the steps indicate a preferred method flow. Method 50 requires that only a portion of the trellis is stored in an internal memory module. It is fast and does not require a learning period.

Method 50 starts in step 52 of providing a trellis representative of an output of a convolutional encoder, the convolutional encoder has a coding rate of R, the trellis having a block length T and is divided to windows.

Step 52 is followed by step 54 of assigning an initial conditions to each node of the ending stage and starting stage of the trellis.

Step 54 is followed by step 56 of computing a backward metric for each node, starting from the end of the trellis and advancing backward through the trellis and storing backward metrics of nodes of a plurality of ending stages of windows. Preferably, the backward metrics of the nodes of the ending stages of windows are stored in an external memory module.

Step 56 is followed by step 60 of computing lambdas. Step 60 conveniently comprises of steps 62, 64, and 66. Steps 62–66 are repeated until the all lambdas of the trellis are calculated.

During step 62 retrieving backward metrics of nodes of a starting stage of a window, the retrieved backward metrics were computed and stored during step 66. Conveniently, the windows are selected so that the forward metrics of the nodes of the starting stage can be calculated in a swift and in an exact manner. Usually, the computation of forward metrics of nodes of an starting stages of a window that is not a first window in the trellis, is preceded by a computation of a forward metrics of a preceding window, wherein the ending stage of the preceding window is followed by the starting stage of the window. Preferably, during a first iteration of steps 62–66 the lambdas of the first window of the trellis are calculated and further iterations are used to calculate the lambdas of consecutive windows.

Step 62 is followed by step 64 of computing and storing backward metrics for each node, starting from the stage that precedes the last stage of the window and ending at the starting stage of the window. Preferably, the backward metrics are stored in an internal memory module.

Step 64 is followed by step 66 of computing forward metrics for each node, starting from the starting stage of the window and ending at the ending stage of the window; wherein when forward metrics of nodes of a stage are computed and the backward metrics of the nodes of an adjacent stage were previously computed, the computation of forward metrics is integrated with the computation of lambda from the stage to the adjacent stage. After a lambda is calculated it is stored. Preferably it is stored in an external memory module. As indicated by path 61, step 66 is followed by step 62 until all lambdas of the trellis are calculated and stored.

Conveniently, all windows have the same length WN, wherein WN is much smaller than T. The windows do not overlap. Preferably, step 60 starts by calculating lambdas of the first window of the trellis and advances forward through the trellis.

Preferably, method 50 is used to implement the Log MAP algorithms. Conveniently, gammas are calculated during steps 54 and 64.

Figure 3:
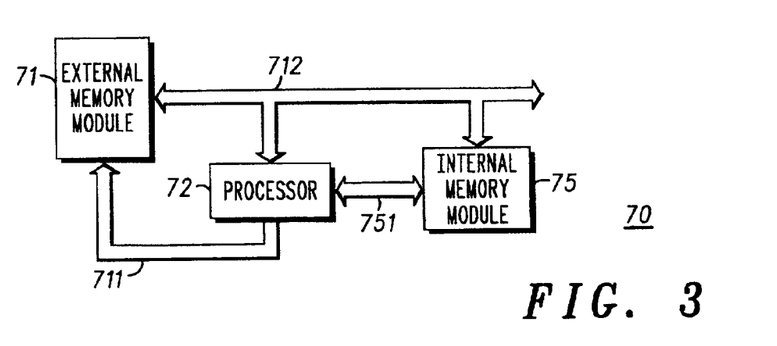
FIGS. 3–4 are schematic descriptions of systems for implementing the methods shown in FIGS. 1 and 2.
Figure 4:
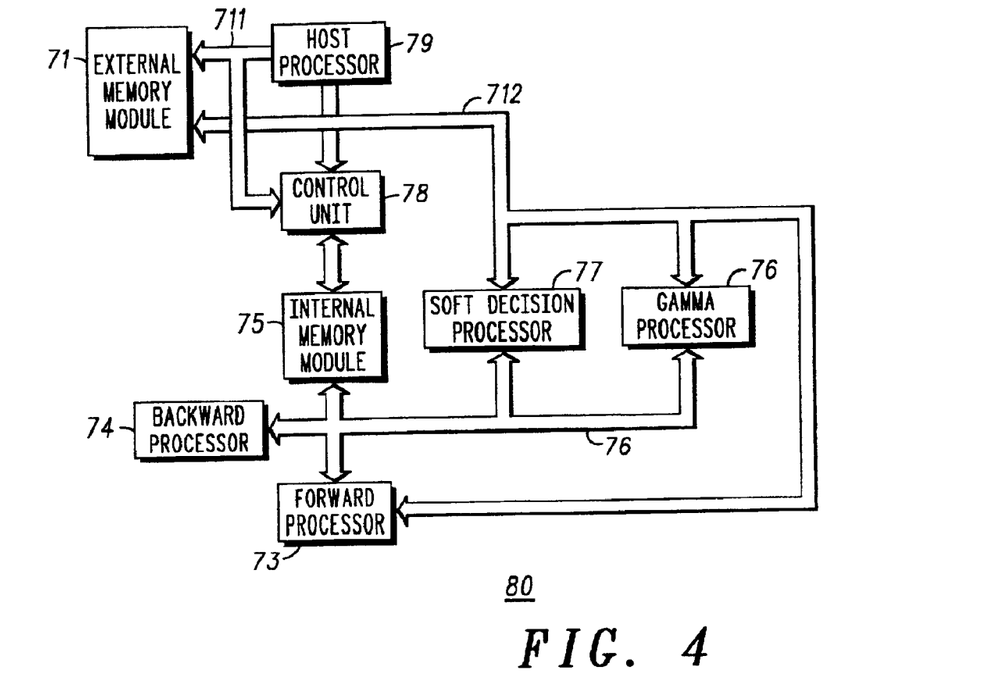

FIGS. 3–4 are schematic descriptions of system 70 and 80 for implementing methods 30 and 50. System 70 comprising external memory module 71; processor 72 that is coupled to external memory 71 via data bus 712 and control and address bus 711; internal memory module 75 coupled to processor 72 via bus 751. System 80 is analogues to system 70 but instead of processor 72 has forward processor 73, gamma processor 76, backward processor 74, soft decision processor 77, host processor 79 and optional control unit 78. Conveniently, system 80 further comprises of control unit 78, for coordinating the calculations of various variables and the access to internal and external memory modules 71 and 75. A man who is skilled in the art will appreciate that the calculations of alphas, betas, gammas and lambdas can be made by various processors and various configurations of processors.

Host processor 79 is coupled to external memory module 71 via address and control bus 711 and data bus 712 and is coupled to control unit 78 via control bus 791. Internal memory module 75 is coupled to control unit 78 via bus 781 and to soft decision processor 77, gamma processor 76, backward processor 74 and forward processor 73 via internal buses 751. Forward processor 73 and backward processor 74 are also coupled to bus 712.

Internal memory module 75 is adapted to store variables that are required during steps 40 or 60, such as the forward metrics of nodes of a window, the backward metrics of nodes of a window, the gammas of a window. External memory module 71 is adapted to store information that is associated with the whole trellis. The information can comprise of a set of systematic input signals Ys, two sets of either parity input signals Yp1, Yp2 or parity input signals Yp3, Yp4, and a set of a-priory lambdas L.

Forward processor 73 is adapted to fetch information, such as a plurality of input signals from external memory module 75 and to compute forward metrics (alphas). Backward processor 74 is adapted to fetch information, such as a plurality of received signals from external memory module 75 and to compute backward metrics (betas).

Control unit 78 allows forward processor 73 to access external memory module 71 during step 36 and internal memory module 75 during steps 44, allows backward processor 74 to access external memory module 75 during step 56 and internal memory module 75 during steps 64.

Soft decision processor 77 is adapted to access internal memory module 75, gamma processor 76, backward processor 74 and forward processor 73 to receive forward metrics and backward metrics and gammas and to calculate lambdas during steps 46 and 66. These lambdas are further sent to external memory unit during steps 46 and 66.

Figure 5:
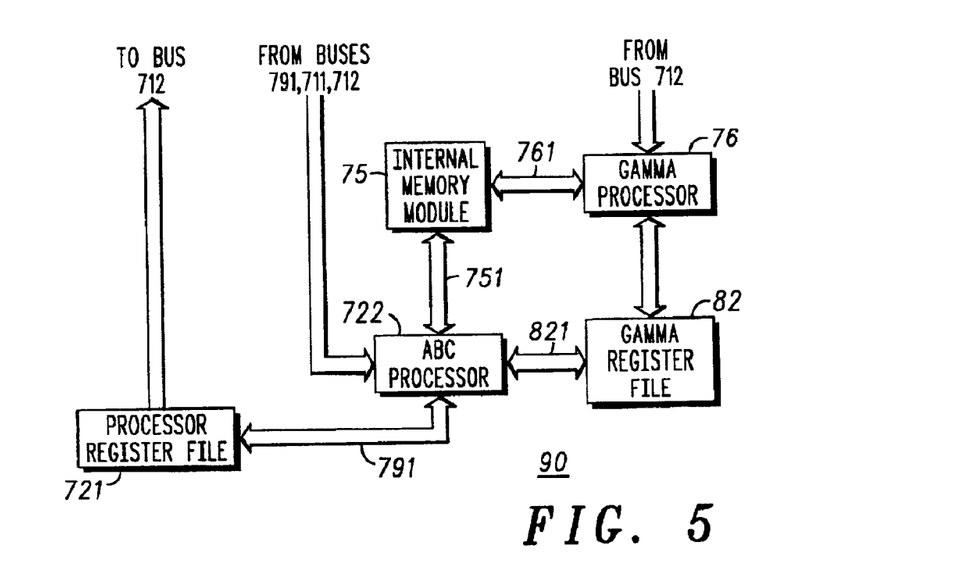
FIG. 5 is a schematic description of a system for decoding a sequence of signals output by a convolutional encoder and transmitted over a channel according to a preferred embodiment of the invention.

FIG. 5 is a schematic descriptions of system 90 for decoding a sequence of signals output by a convolutional encoder and transmitted over a channel according to a preferred embodiment of the invention.

System 90 is coupled to a host processor 79 and external memory module 71 via buses 791, 711 and 712.

System 90 comprising of gamma processor 76, gamma register file 82, internal memory module 75, abc processor 722 and processor register file 721. Abc processor 72 is coupled to gamma register file 82, to processor register file 721 and to internal memory module via buses 821, 791 and 751; Gamma processor 76 is coupled to gamma register file 82 via bus 822 and to internal memory module 75 via bus 761.

Gamma processor 76 and processor register file 721 are coupled to bus 712 for receiving initial conditions and input signals, and for providing alphas during step 36 or betas during step 56.

Gamma register file 82 is used to store gammas. Processor register file 79 is used to store alphas and betas that are calculated by abc processor 722 and to store intermediate variables and results that are required for calculating alphas, betas and lambdas. An exemplary implementation of system 90 (referred to as system 100) is shown in greater detail in FIG. 6.

Figure 6:
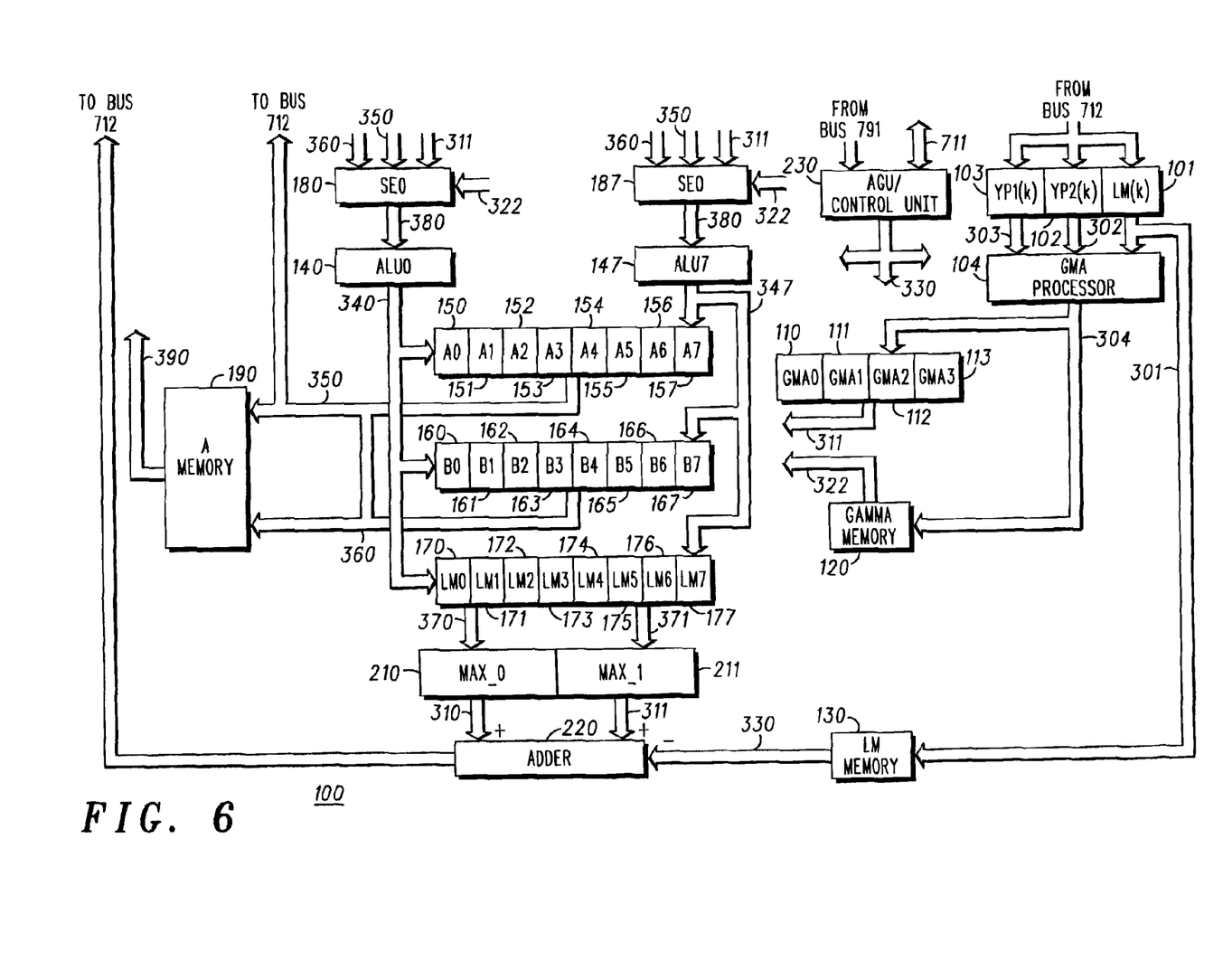
FIG. 6 is a detailed description of a system for decoding a sequence of signals output by a convolutional encoder and transmitted over a channel according to a preferred embodiment of the invention.

FIG. 6 is a detailed description of system 100 for decoding a sequence of signals output by a convolutional encoder and transmitted over a channel according to a preferred embodiment of the invention.

Systems 60, 70, 80, 90 and 100 can be implemented as a dedicated hardware accelerator within an embedded system, for enhancing for enhancing the performances of embedded systems.

System 100 is adapted to calculate lambdas according to method 30 and 50, when R equals $\frac{1}{2}$, $\frac{1}{3}$, $\frac{1}{4}$, $\frac{1}{5}$ or $\frac{1}{6}$, each stage comprises of 8 nodes, and the length of all windows, except a last window of the trellis, is 64 stages. System 100 is adapted to perform 8 ACS butterflies calculations in a single clock cycle.

For convenience of explanation it is assumed that system 100 implements method 30. If system 100 implements method 50 then alpha memory 190 is used to store betas of a window and bus 360 is used to couple beta registers 160–167 to bus 712.

It is assumed that system 100 calculates $\Lambda k$ that is associated to a transition from a (k−1)'th stage of the trellis to the k'th stage. The (k−1)'th stage comprising of eight nodes N0,k−1; N1,k−1; N2,k−1; N3,k−1; N4k−1; N5,k−1; N6,k−1; N7, k−1 and the k'th stage has eight nodes N0,k; N1,k; N2,k; N3,k; N4,k; N5,k; N6,k and N7,k. The forward metrics of the N0,k−1 till N7,k−1 are denoted $\alpha(0,k-1)$, $\alpha(1,k-1)$, $\alpha(2,k-1)$, $\alpha(3,k-1)$, $\alpha(4,k-1)$, $\alpha(5,k-1)$, $\alpha(6,k-1)$ and $\alpha(7,k-1)$. The backward metrics of nodes N0,k till N7,k are denoted $\beta(0,k)$, $\beta(1,k)$, $\beta(2,k)$, $\beta(3,k)$, $\beta(4,k)$, $\beta(5,k)$, $\beta(6,k)$ and $\beta(7,k)$. Branch metrics $\gamma 0,k$ is assosiated to a transition from (to) N0,k−1 to (from) N4,k and from (to) N1,k−1 to (from) N0,k. Branch metrics $-\gamma 0,k$ is assosiated to a transition from (to) N0,k−1 to (from) N0,k and from (to) N1,k−1 to (from) N4,k. Branch metrics $\gamma 1,k$ is assosiated to a transition from (to) N2,k−1 to (from) N1,k and from (to) N3,k−1 to (from) N5,k. Branch metrics $-\gamma 1,k$ is assosiated to a transition from (to) N2,k−1 to (from) N5,k and from (to) N3,k−1 to (from) N1,k. Branch metrics $\gamma 2,k$ is assosiated to a transition from (to) N5,k−1 to (from) N2,k and from (to) N4,k−1to (from) N6,k. Branch metrics $-\gamma 2,k$ is assosiated to a transition from (to) N4,k−1 to (from) N2,k and from (to) N5,k−1 to (from) N6,k. Branch metrics $\gamma 3,k$ is assosiated to a transition from (to) N6,k−1 to (from) N3,k and from (to) N7,k−1 to (from) N7,k. Branch metrics $-\gamma 3,k$ is assosiated to a transition from (to) N6,k−1 to (from) N7,k and from (to) N7,k−1 to (from) N3,k.

Branch metrics $\gamma 0,k$ $-\gamma 3,k$ are given by the following equations:

$$\gamma 0,k = -(Lk+Yp1,k+Yp2,k) \quad (1)$$

$$\gamma 1,k = -(Lk-Yp1,k+Yp2,k) \quad (2)$$

$$\gamma 2,k = -(Lk+Yp1,k-Yp2,k) \quad (3)$$

$$\gamma 3,k = -(Lk+Yp1,k-Yp2,k) \quad (4)$$

The forward metrics are given by the following equations:

$$\alpha(0,k)=\text{MAX}[(\alpha(1,k-1)+\gamma 0,k), (\alpha(0,k-1)-\gamma 0,k)] \quad (5)$$

$$\alpha(1,k)=\text{MAX}[(\alpha(2,k-1)+\gamma 1,k), (\alpha(3,k-1)-\gamma 1,k)] \quad (6)$$

$$\alpha(2,k)=\text{MAX}[(\alpha(5,k-1)+\gamma 2,k), (\alpha(4,k-1)-\gamma 2,k)] \quad (7)$$

$$\alpha(3,k)=\text{MAX}[(\alpha(6,k-1)+\gamma 3,k), (\alpha(7,k-1)-\gamma 3,k)] \quad (8)$$

$$\alpha(4,k)=\text{MAX}[(\alpha(0,k-1)+\gamma 0,k), (\alpha(1,k-1)-\gamma 0,k)] \quad (9)$$

$$\alpha(5,k)=\text{MAX}[(\alpha(3,k-1)+\gamma 1,k), (\alpha(2,k-1)-\gamma 1,k)] \quad (10)$$

$$\alpha(6,k)=\text{MAX}[(\alpha(4,k-1)+\gamma 2,k), (\alpha(5,k-1)-\gamma 2,k)] \quad (11)$$

$$\alpha(7,k)=\text{MAX}[(\alpha(7,k-1)+\gamma 3,k), (\alpha(6,k-1)-\gamma 3,k)] \quad (12)$$

The backward metrics are given by the following equations:

$$\beta(0,k-1)=\text{MAX}[(\beta(4,k)+\gamma 0,k), (\beta(0,k)-\gamma 0,k)] \quad (13)$$

$$\beta(1,k-1)=\text{MAX}[(\beta(0,k)+\gamma 0,k), (\beta(4,k)-\gamma 0,k)] \quad (14)$$

$$\beta(2,k-1)=\text{MAX}[(\beta(1,k)+\gamma 1,k), (\beta(5,k)-\gamma 1,k)] \quad (15)$$

$$\beta(3,k-1)=\text{MAX}[(\beta(5,k)+\gamma 1,k), (\beta(1,k)-\gamma 1,k)] \quad (16)$$

$$\beta(4,k-1)=\text{MAX}[(\beta(6,k)+\gamma 2,k), (\beta(2,k)-\gamma 2,k)] \quad (17)$$

$$\beta(5,k-1)=\text{MAX}[(\beta(2,k)+\gamma 2,k), (\beta(6,k)-\gamma 2,k)] \quad (18)$$

$$\beta(6,k-1)=\text{MAX}[(\beta(3,k)+\gamma 3,k), (\beta(7,k)-\gamma 3,k)] \quad (19)$$

$$\beta(7,k-1)=\text{MAX}[(\beta(7,k)+\gamma 3,k), (\beta(3,k)-\gamma 3,k)] \quad (20)$$

Lambda is given by the following equations:

$$\Lambda k=(\text{Max}(0)-\text{Max}(1))/2-Lk \quad (21)$$

$$\text{Max}(0)=\text{MAX}\ [(\alpha(4,k-1)+\beta(2,k)-\gamma 2,k),$$

$$(\alpha(0,k-1)+\beta(0,k)-\gamma 0,k), (\alpha(5,k-1)$$

$$+\beta(6,k)-\gamma 2,k), (\alpha(1,k-1)+\beta$$

$$(4,k)-\gamma 0,k), (\alpha(2,k-1)+\beta(3,k)-\gamma 3,k),$$

$$(\alpha(3,k-1)+\beta(1,k)-\gamma 1,k), (\alpha(6,k-1)+\beta(7,k)$$

$$-\gamma 3,k), (\alpha(2,k-1)+\beta(5,k)-\gamma 1,k)]. \quad (22)$$

$$\text{Max}(1)=\text{MAX}\ [(\alpha(4,k-1)+\beta(6,k)+\gamma 2,k), (\alpha$$

$$(0,k-1)+\beta(4,k)+\gamma 0,k), (\alpha(5,k-$$

$$1)+\beta(2,k)+\gamma 2,k), (\alpha(1,k-1)+\beta$$

$$(0,k)+\gamma 0,k), (\alpha(6,k-1)+\beta(3,k)$$

$$+\gamma 3,k), (\alpha(2,k-1)+\beta(1,k)+\gamma 1,k),$$

$$(\alpha(7,k-1)+\beta(7,k)+\gamma 3,k), (\alpha(3,k-1)+\beta$$

$$(5,k)+\gamma 1,k)]. \quad (23)$$

When a Log MAP algorithm is implemented, the calculation involves the addition of a correction factor shat is preferably stored in a look up table. The correction factor is not required when a Max Log Map algorithm is implement. Such a look up table (not shown) is coupled to ALU0–ALU7 140–147, MAX_0 and MAX_1 units 210 and 211 or forms a part of each of the mentioned units.

System 100 is coupled to bus 712, for exchanging information with external memory module 71, it is coupled to bus 791 for receiving control signals from host processor 79 and is coupled to bus 711 for providing control signals and addresses to external memory module 71. System 100 has an address generator and control unit (i.e.—control unit) 230 that controls other units of system 100 and controls the exchange of information with external memory module. Control unit 230 is coupled to the other units of system 230 by bus 330 and just for convenience of explanation the various connections are not shown.

System 100 comprises of registers 103, 102 and 101 for storing Yp1,k, Yp2,k, and a-priori lambda Lk. Gamma processor 104 for receiving the content of registers 101–103, calculating $\gamma 0,k$, $\gamma 1,k$, $\gamma 2,k$ and $\gamma 3,k$ according to equations (1)–(4) and providing them to registers 110–113. Gamma memory 120 for storing gammas of a window. A- priory lambda memory 130 for storing a-priory lambdas of a window. Eight alpha registers 150–157 for storing eight alphas. Eight beta registers 160–167 for storing eight betas. Eight lambda registers 170–177 for storing eight intermediate results that are used to calculate lambda. Eight selection units 180–187, coupled to registers 150–157, alpha memory 190, registers 110–113 and gamma memory 120 for providing alphas, betas and gammas to eight arithmetic control units ALU0–ALU7 140–147. ALU0–ALU7 140–147 for implementing equations (5)–(20) and providing the results of their calculations to alpha registers 150–157, beta registers 160–167 and lambda registers 170–177. During steps 46 and 66 ALU0–ALU7 140–147 provide lambda registers 160–167 with eight intermediate results. These results are shown in brackets in equations (22) and (23). Alphas are provided to registers 150–157, betas are provided to registers 160–167. Eight intermediate results are provided to registers 170–177. MAX_0 unit 210 implements equation (22) and provides max(0) to adder 220. MAX_1 unit 211 implements equation (23) and provides max(1) to adder 220. Adder 220 shifts both max(0) and max(1) to the right, subtracts max(1) from max(0), subtracts Lk from the product and provides Λk. Selection units 180–187 select which variables are provided to ALU0–ALU7 140–147. For example, during a calculation of α(0,k) in step 36 selection unit 180 provides ALU0 140 with α(0,k−1) from register 150, α(1,k−1) from register 151 and γ0,k from register 110 so that ALU0 140 can implement equation (5). During a calculation of gamma in step 46 selection unit 180 provides ALU0 140 α(4,k−1) from alpha memory 190, β(2,k) from register 162 and γ2,k from gamma memory 120.

Registers 101–103 are coupled to data bus 712 and are coupled to gamma processor 104 via buses 301–303. Registers 110–113 are coupled to gamma processor 104 via bus 304 and to selection units 180–187 via bus 311. Gamma memory 120 is coupled to gamma processor via bus 304 and to selection units 180–187 via bus 311. A-priori lambda memory is coupled to register 101 via bus 301 and to adder 220 via bus 330. Selection units 180–187 are coupled to alpha registers 150–157 and beta registers 160–167 via buses 350 and 360 and to gamma memory 120 via bus 120. Preferably portions of buses 350, 360, 322 and 311 are coupled to each selection unit. For example, selection unit 180 is coupled to portions of bus 350 to receive the content of alpha registers 150 and 151. Bus 350 and 360 are coupled to bus 712 and to alpha memory 190. ALU0–ALU7 140–147 are coupled to selection units 180–187 via buses 380–387, to alpha registers 150–157 beta registers 160–167 and intermediate lambda registers 170–177 via buses 340–347. MAX_0 and MAX_1 units 210 and 211 are coupled via buses 370 and 371 to intermediate lambda registers 170–177 and via buses 310 and 311 to adder 220. Adder 220 is coupled to bus 712.

During step 34 initial condition of nodes are provided to alpha registers 150–157 and beta registers 160–167 from external memory module 71 via buses 350 and 360.

During step 36 system 100 calculates gammas and alphas of the whole trellis. For example, it is assumed that α(0,k)–α(7,k) and γ0,k–γ3,k are calculated.

The calculation of γ0,k–γ3,k is done by providing Yp1,k, Yp2,k and Lk from registers 101–103 to gamma processor 104, implementing equations (1)–(4) and storing the result in registers 110–113.

The calculation of alphas α(0,k−1)–α(7,k−1)) is done by providing ALU0–ALU7 140–147 gammas from registers 110–113, previous alphas (α(0,k−1)–α(7,k−1)) from alpha registers 150–157 implementing equations (5)–(12) and storing alphas α(0,k)–α(7,k) in alpha registers 150–157. Alphas of nodes of starting stages of windows are provided via buses 350 and 712 to externel memory module 71.

During step 42 alphas of nodes of a starting stage of a window are provided via buses 350 and 712 from externel memory module 71 to alpha registers 150–157. Preferably, host processor 79 provides the control and address signals and selects which window to process.

During step 44 alphas and gammas of a window are calculated, equations (1)–(4) and (5)–(12) are implemented by activating regiaters 101–103, gamma processor 104, gamma registers 110–113 selection units 180–187, ALU0–ALU7 140–147 and alpha registers 150–157, as in step 36 but the alphas and gammas of nodes of the window are stored in alpha memory 190 and in gamma memory 120 so that when step 44 ends gamma memory 120 stores the all the gammas of the window and alpha memory 190 stores all the alphas of the window.

During step 46 the gammas of a window are calculated. Gammas from gamma memory 120 and betas from bata registers 160–167 are used to implement equations (13)–(20) and (21)–(23) so that the betas and lambdas of the window are calculated. Equations (13)–(20) are implemented by providing previous betas from beta registers 160–167 and gammas from gamma memory 120 to selection units 180–187 and calculating betas. Lambdas are calculated by providing betas from beta registers 160–167, alphas from alpha memory 190 and gammas from gamma memory 120 to selection units 180–187 and to ALU0–ALU7 140–147. ALU0–ALU7 140–147 provide eight intermediate results to lambda registers 170–177, four intermediate results are provided to MAX_0 unit 210 and four are provided to MAX_1 unit 211 for implementing equations (22) and (23) and providing max(0) and max(1) to adder 220. Adder 220 shifts max(0) and max(1) to the right, subtracts max(1)/2 from max(1)/2 and subtracts from the result an a-priori lambda from memory 130 and provides lamdbas to external memory via bus 712.

It should be noted that the particular terms and expressions employed and the particular structural and operational details disclosed in the detailed description and accompanying drawings are for illustrative purposes only and are not intended to in any way limit the scope of the invention as described in the appended claims.

Thus, there has been described herein an embodiment including at least one preferred embodiment of an improved method and apparatus for implementing a method and a device for performing SISO decoding. It will be apparent to those skilled in the art that the disclosed subject matter may be modified in numerous ways and may assume many embodiments other then the preferred form specifically set out and described above.

Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather then the foregoing detailed description.

We claim:

1. A method for performing soft-input soft-output (SISO) decoding, the method comprising the steps of:

(One) providing a trellis representative of an output of a convolutional encoder, the convolutional encoder has a coding rate of R, the trellis having a block length T and is divided to windows;

(Two) assigning an initial condition to each node of a starting stage and an ending stage of the trellis;

(Three) computing a forward metric for each node, starting from he starting stage of the trellis and advancing forward through the trellis and storing forward metrics of nodes of a plurality of starting stages of windows;

(Four) repeating the following substeps until all probability factors (lambdas) associated to the trellis are calculated:

(1) retrieving forward metrics of nodes of a starting stage of a window, the retrieved forward metrics were computed and stored during said step of computing a forward metric for each node;

(2) computing and storing forward metrics for each node, starting from a second stage of the window and ending at the ending stage of the window;

(3) computing backward metrics for each node starting from the ending stage of the window and ending at the starting stage of the window; wherein when backward metrics of nodes of a stage are computed and the forward metrics of the nodes of an adjacent stage were previously computed in substep (2), the computation of backward metrics is integrated with the computation of lambda from the stage to the adjacent stage, and;

(4) storing the computed lambda.

2. The method of claim 1 wherein starting to compute the lambdas of a last window of the trellis and advancing backwards through the trellis.

3. The method of claim 1 wherein a number of branch metric values are computed during step (2).

4. The method of claim 1 wherein all windows except a last window of the trellis have a window length that is much smaller than a trellis block length.

5. The method of claim 1 wherein the windows do not overlap.

6. The method of claim 1 wherein a computation of backward metric of nodes of an ending stage of a window that is not a last window in the trellis, is preceded by a computation of a backward metric of a following window, wherein the starting stage of the following window follows the ending stage of the window.

7. The method of claim 1 wherein said step of computing a forward metric for each node involves storing the forward metrics of nodes of the starting stages of windows in an external memory module.

8. The method of claim 1 wherein step (3) involves storing the lambdas in an external memory module.

9. The method of claim 1 wherein step (2) involves storing the forward metrics in an internal memory module.

10. The method of claim 1 wherein the method is used to implement a Log MAP algorithm.

11. A method for performing soft-input soft-output (SISO) decoding, the method comprising the steps of:

(One) providing a trellis representative of an output of a convolutional encoder, the convolutional encoder has a coding rate of R, the trellis having a block length T and is divided to windows;

(Two) assigning an initial condition to each node of an ending stage and a starting stage of the trellis;

(Three) computing a backward metric for each node, starting from nodes the ending stage of the trellis and advancing backward through the trellis and storing backward metrics of nodes of a plurality of ending stages of windows;

(Four) repeating the following substeps until all probability factor (lambdas) associated to the trellis are calculated:

(1) retrieving backward metrics of nodes of an ending stage of a window, the retrieved backward metrics were computed and stored during said step of computing a backward metric for each node;

(2) computing and storing backward metrics for each node, starting from a stage that precedes the ending stage of the window, and ending stage of the window and ending at the first stage of the window;

(3) computing forward metrics for each node starting from the starting stage of the window and ending at the ending stage of the window; wherein when forward metrics of nodes of a stage are computed and the backward metrics of the nodes of an adjacent stage were previously computed in substep (2), the computation of forward metrics is integrated with the computation of lambda from the stage to the adjacent stage, and;

(4) storing the computed lambda.

12. The method of claim 11 wherein computing the lambdas of a first window of the trellis and advancing forwards through the trellis.

13. The method of claim 11 wherein a number of branch metric values are computed during step (2).

14. The method of claim 11 wherein all windows except a last window of the trellis have a window length that is much smaller than a trellis block length.

15. The method of claim 11 wherein the windows do not overlap.

16. The method of claim 11 wherein a computation of forward metric of nodes of a starting stage of a window that is not a first window in the trellis, is preceded by a computation of a forward metric of a preceding window, wherein the ending stage of the preceding window is followed by the starting stage of the window.

17. The method of claim 11 wherein said step of computing a backward metric for each node involves storing the backward metrics of nodes of the ending stages of windows in an external memory module.

18. The method of claim 11 wherein step (3) involves storing the lambdas in an external memory module.

19. The method of claim 11 wherein step (2) involves scoring the backward metrics in an internal memory module.

20. The method of claim 11 wherein the method is used to implement a Log MAP algorithm.

21. A system for decoding a sequence of signals output by a convolutional encoder and transmitted over a channel, the encoder output represented by a trellis having a block length T, the system comprising:

an internal memory module, for storing forward metrics;

an external memory module, adapted to store a plurality of variables that are required for calculating probability factors (lambdas) associated to the trellis; and a processor, coupled to the external memory and the internal memory for calculating forward metrics, backward metrics, branch metrics and lambdas an for accessing the external and internal memory modules;

wherein the system is adapted to calculate the forward metrics of all the trellis, store forward metrics of nodes of starting stages of windows, calculate forward metrics and branch metrics of a window, store the forward metrics and branch metrics in the internal memory module, use the forward metrics and branch metrics within the internal memory module to calculate lambdas of the window, whereas the system calculates the lambdas of various windows until all lambdas of the trellis are calculated.

22. The system of claim 21 wherein the system start to compute the lambdas of a last window of the trellis and advances backwards through the trellis.

23. The system of claim 22 wherein all windows except a last window of the trellis have a window length that is much smaller than a trellis block length.

24. The system of claim 22 wherein the windows do not overlap.

25. The system of claim 22 wherein the system computes a backward metric of nodes of an ending stage of a window that is not a last window in the trellis, after the system calculates a backward metric of a following window, wherein the starting stage of the following window follows the ending stage of the window.

26. The system of claim 22 wherein the system stores the forward metrics of nodes of starting stages of windows in the external memory module.

27. The system of claim 22 wherein the system stores the lambdas it calculates in the external memory module.

28. The system of claim 22 wherein the system stores the forward metrics and the branch metrics of a window in the internal memory module.

29. The system of claim 22 wherein the system is used to implement a Log MAP algorithm.

30. A system for decoding a sequence of signals output by a convolutional encoder and transmitted over a channel, the encoder output represented by a trellis having a block length T, the system comprising:

an internal memory module, for storing forward metrics;

an external memory module, adapted to store a plurality or variables that are required for calculating probability factors (lambdas) associated to the trellis; and a processor, coupled to the external memory and the internal memory for calculating forward metrics, backward metrics, branch metrics and lambdas and for accessing the external and internal memory modules;

wherein the system is adapted to calculate the backward metrics of all the trellis, store backward metrics of nodes of ending stages of windows, calculate backward metrics and branch metrics of a window, store the backward metrics and branch metrics in the internal memory module, use the backward metrics and branch metrics within the internal memory module to calculate lambdas of the window, whereas the system calculates the lambdas various windows until all lambdas of the trellis are calculated.

31. The system of claim 30 wherein the system starts to compute the lambdas of a first window of the trellis and advances forward through the trellis.

32. The system of claim 30 wherein all windows except a first window of the trellis have a window length that is much smaller than a trellis block length.

33. The system of claim 30 wherein the windows do not overlap.

34. The system of claim 30 wherein the system computes a forward metric of nodes of a starting stage of a window that is not a first window in the trellis, after the system calculates a forward metric of a previous window, wherein the ending stage of the previous window precedes the starting stage of the window.

35. The system of claim 30 wherein the system stores the backward metrics of nodes of starting stages of windows in the external memory module.

36. The system of claim 30 wherein the system scores lambda that it calculates in the external memory module.

37. The system of claim 30 wherein the system stores the backward metrics and the branch metrics of a window in the internal memory module.

38. The system of claim 30 wherein the system is used to implement Log MAP algorithm.

* * * * *